(12) United States Patent
Molina et al.

(10) Patent No.: US 12,328,127 B2
(45) Date of Patent: Jun. 10, 2025

(54) SYSTEM AND METHOD FOR CALIBRATING AN ANALOG-TO-DIGITAL CONVERTER USING A RATIONAL SAMPLING FREQUENCY CALIBRATION DIGITAL-TO-ANALOG CONVERTER

(71) Applicant: Intel Corporation, Santa Clara, CA (US)

(72) Inventors: Albert Molina, Novelda (ES); Kameran Azadet, San Ramon, CA (US); Martin Clara, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 658 days.

(21) Appl. No.: 17/645,461

(22) Filed: Dec. 22, 2021

(65) Prior Publication Data

US 2023/0198536 A1 Jun. 22, 2023

(51) Int. Cl.
*H03M 1/10* (2006.01)
*H03M 1/06* (2006.01)
*H03M 1/00* (2006.01)
*H03M 1/68* (2006.01)

(52) U.S. Cl.
CPC ....... *H03M 1/1033* (2013.01); *H03M 1/0629* (2013.01); *H03M 1/002* (2013.01); *H03M 1/1014* (2013.01); *H03M 1/68* (2013.01)

(58) Field of Classification Search
CPC .. H03M 1/1033; H03M 1/0629; H03M 1/002; H03M 1/1014; H03M 1/68
See application file for complete search history.

(56) References Cited

U.S. PATENT DOCUMENTS

| 2016/0134302 A1* | 5/2016 | Schafferer | H03M 3/458 341/120 |
|---|---|---|---|
| 2017/0254844 A1 | 9/2017 | Sestok, IV | |

OTHER PUBLICATIONS

J. Chuang and H. Krishnaswamy, "19.4 A 0.0049mm2 2.3GHZ sub-sampling ring-oscillator PLL with time-based loop filter achieving-236.2dB jitter-FOM," 2017 IEEE International Solid-State Circuits Conference (ISSCC), 2017, pp. 328-329, doi: 10.1109/ISSCC.2017.7870394.

(Continued)

*Primary Examiner* — Joseph J Lauture
(74) *Attorney, Agent, or Firm* — 2SPL Patent Attorneys PartG mbB; Yong Beom Hwang

(57) ABSTRACT

An analog-to-digital conversion system. A clock generator generates a first clock signal at a first frequency. An analog-to-digital converter (ADC) converts an input analog signal to a digital signal. The ADC operates based on the first clock signal at the first frequency. A calibration digital-to-analog converter (DAC) generates an analog reference signal from digital reference data. A fractional rate clock generator generates a second clock signal from the first clock signal. The second clock signal is at a second frequency that is a fractional rate of the first frequency, and the calibration DAC operates at the second frequency. An equalizer processes an output of the ADC to remove a distortion incurred by the ADC and a calibration circuitry generates coefficients for the equalizer based on the digital reference data and the output of the ADC to the analog reference signal.

19 Claims, 9 Drawing Sheets

(56) References Cited

OTHER PUBLICATIONS

R. Farjad-Rad et al., "A low-power multiplying DLL for low-jitter multigigahertz clock generation in highly integrated digital chips," in IEEE Journal of Solid-State Circuits, vol. 37, No. 12, pp. 1804-1812, Dec. 2002, doi: 10.1109/JSSC.2002.804340.

D. Dunwell, A. C. Carusone, J. Zerbe, B. Leibowitz, B. Daly and J. Eble, "A 2.3-4GHz injection-locked clock multiplier with 55.7% lock range and 10-ns power-on," Proceedings of the IEEE 2012 Custom Integrated Circuits Conference, 2012, pp. 1-4, doi: 10.1109/CICC.2012.6330577.

W.-C. Lai, S.-L. Jang, H.-A. Yeh and M.-H. Juang, "A Low-Power Injection-Locked Frequency Tripler in 90 nm CMOS Technology," 2020 IEEE 5th International Conference on Integrated Circuits and Microsystems (ICICM), 2020, pp. 96-100, doi: 10.1109/ICICM50929.2020.9292276.

D. M. Kang, H. S. Lee, S. H. Kim, T. H. Jang, C. W. Byeon and C. S. Park, "A +3.0-dBm 115-129-GHz CMOS Power-Efficient Injection-Locked Frequency Tripler Chain," in IEEE Microwave and Wireless Components Letters, vol. 30, No. 5, pp. 508-511, May 2020, doi: 10.1109/LMWC.2020.2984126.

T. Seong, Y. Lee and J. Choi, "Ultralow In-Band Phase Noise Injection-Locked Frequency Multiplier Design Based on Open-Loop Frequency Calibration," in IEEE Transactions on Circuits and Systems II: Express Briefs, vol. 61, No. 9, pp. 701-705, Sep. 2014, doi: 10.1109/TCSII.2014.2335435.

\* cited by examiner

SYSTEM AND METHOD FOR CALIBRATING AN ANALOG-TO-DIGITAL CONVERTER USING A RATIONAL SAMPLING FREQUENCY CALIBRATION DIGITAL-TO-ANALOG CONVERTER

BACKGROUND

A multi-channel transceiver chip may include a plurality of receiver analog-to-digital converters (ADCs). These ADCs need calibration in one form or another to achieve the required performance. For calibration of the ADCs, a reference signal may be generated by an on-chip calibration digital-to-analog converter (DAC). The reference signal is distributed to an extra input of an ADC during the calibration phase. With the help of the known reference signal, certain parameters of the digital processing unit performing the ADC correction functions may be determined, which can also contain non-linear components.

Calibration may be performed either without a traffic signal in the foreground, e.g., at the start-up or during specific maintenance intervals defined by the system, or entirely in the background while processing traffic signals simultaneously. In the latter case, the reference signal is usually small, and it is overlayed (added) onto the traffic input signal in an analog input stage of the receiver. In the digital backend of the receiver the known injected reference signal may be then subtracted from the sampled and quantized version of the wanted traffic signal, or its spectral properties are such that it does not interfere with the traffic signal spectrum and can therefore be easily filtered away with a digital filter downstream of the ADC.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
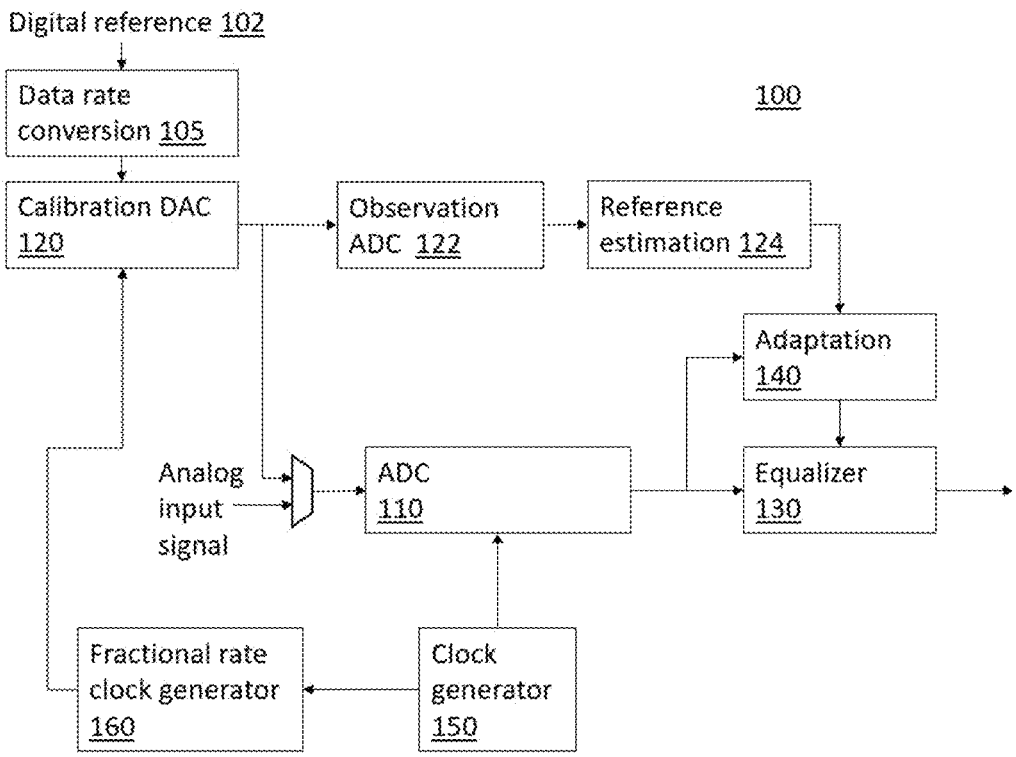
FIG. 1 is a block diagram of an example system for analog-to-digital conversion.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

For calibration of ADCs, a reference signal may be generated with a calibration DAC (CALDAC) that samples at the same rate as an ADC under calibration and an analog filter (an anti-alias filter) may be used to suppress the frequency images of the DAC output. With the ADC (and the CALDAC) sampling rate $f_{adc}$ and the maximum input frequency considered for calibration $f_{max} < f_{adc}/2$, this anti-alias filter should offer sufficient suppression at the (image) signal frequencies $f > f_{adc}/2 + (f_{adc}/2 - f_{max})$ because the insufficiently filtered spectral images from the CALDAC cannot be distinguished from the original input signal. Therefore, the residual spectral images (due to the limited CALDAC output filter image rejection) in the reference signal used for calibration put an upper limit on the post-calibration accuracy of the digitally corrected ADC.

With $f_{max}$ close to $f_{adc}/2$, a very sharp anti-alias filter is required. Accurate high-order on-chip LC-filters are hard to implement, take up a considerable silicon area, and suffer from significant losses, especially in on-chip implementations. Moreover, if ADC operation (and calibration) at different sampling rates ($f_{adc}$) is desired, it would require either multiple filters with RF-multiplexing function, which requires even more silicon area as well as a potential difficult implementation for the RF-multiplexer, or a single tunable LC-filter, which is only possible within a narrow frequency range.

Alternatively, the calibration DAC may be operated at an integer multiple of the ADC sampling rate, $f_{dac}=n \cdot f_{adc}$, n being a positive integer. This pushes the calibration DAC images out to $n \cdot f_{adc}/2+(n \cdot f_{adc}/2-fmax)$, significantly relaxing the anti-alias filter specification. However, the calibration DAC sampling at $f_{dac}=n \cdot f_{adc}$ requires a DAC capable of such a high sampling rate. A time-interleaved DAC may be used but will necessitate a calibration step to suppress time-interleaving errors in the calibration DAC. Otherwise, these will lead to spurious spectral components in the reference signal at the exact same image frequencies as the original spectral images of the calibration DAC sampling at $f_{ads}$.

Examples are disclosed for a system for ADC calibration. The system includes a calibration DAC for calibration of an ADC. In examples, the calibration DAC samples at a rational fraction p/q (p and q are positive integers) of the ADC sampling frequency $f_{adc}$, i.e., $f_{dac}=p/q \cdot f_{adc}$. A specific choice of $f_{dac}=p/q \cdot f_{adc}$, with suitably chosen integers p and q, allows the digital processing correcting the ADC impairments to distinguish between the aliased spectral components from the calibration DAC and the signal components that are linearly or non-linearly generated in the ADC under calibration. In this case, no sharp (on-chip) anti-alias filter is needed at the output of the calibration DAC. Moreover, the calibration DAC does not have to be operated at a multiple of the ADC sampling frequency.

FIG. 1 is a block diagram of an example system 100 for analog-to-digital conversion. The system 100 includes a clock generator 150, an ADC(s) 110 (i.e., a main ADC(s)), an observation ADC 122, a calibration DAC 120, a fractional rate clock generator 160, an equalizer 130, and an adaptation circuitry 140. The clock generator 150 (e.g., a PLL) is configured to generate a first clock signal at a first frequency. The first clock signal may be a global clock signal distributed to all components in the system 100. The first frequency may be the ADC sampling frequency $f_{adc}$.

The ADC 110 is configured to convert an input analog signal to a digital signal. The ADC 110 is under calibration and operates based on the first clock signal at the first frequency. The calibration DAC 120 is configured to generate an analog reference signal (a calibration signal) from digital reference data for calibration of the ADC 110. The analog reference signal is injected into the ADC 110 via a multiplexer for calibration of the ADC 110. The analog reference signal may be a sinusoid(s). The analog reference signal may be either a single tone signal or a multi-tone signal. Other signals other than a sinusoid may be used, e.g., a chirp, a noise-like signal, etc.

The fractional rate clock generator 160 is configured to generate a second clock signal from the first clock signal. The second clock signal is at a second frequency that is a fractional rate of the first frequency. The fractional rate may be close to one (1). The second clock signal is sent to the calibration DAC 120 and the calibration DAC 120 operates at the second frequency ($f_{dac}$).

The observation ADC 122 converts (samples) the analog calibration signal to a digital domain. The reference estimation circuitry 124 generates a reference signal from the sampled calibration signals for adaptive equalization of the ADC 110. The reference estimation circuitry 124 may remove or reduce the linear or non-linear distortions incurred by the calibration DAC 120 from the sampled reference signal. The adaptation circuitry 140 is configured to generate coefficients for the equalizer 130 based on the reference signal (i.e., the reference data recovered via the observation ADC 122 and the reference estimation circuitry 124, or alternatively the digital reference data 102) and the output of the ADC 110 to the analog reference signal (i.e., the calibration signal). Any conventional digital adaptation algorithm may be used for the adaptation circuitry 140, e.g., a least mean square (LMS), recursive least square (RLS), etc. Instead of using the observation ADC 122 and the reference estimation circuitry 124, the digital reference data may be used by the adaptation circuitry 140 for the generation of the coefficients for the equalizer 130.

The equalizer 130 is configured to process an output of the ADC 110 to remove/reduce a (linear and/or non-linear) distortion incurred by the ADC 110 or any systems preceding the ADC 110, such as a filter, a buffer, a power amplifier, etc. The equalizer 130 may be a digital non-linear filter, e.g., a polynomial or Volterra filter, or a linear filter, e.g., a finite impulse response (FIR) filter or an infinite impulse response (IIR) filter.

The system 100 may include a data rate conversion block 105 configured to supply the digital reference data 102 received at the first frequency to the calibration DAC 120 at the second frequency. The data rate conversion block 105 may be configured to skip q-p samples out of q received samples of the digital reference data 102. The data rate conversion block 105 may be a digital fractional rate filter configured to convert the digital reference data 102 from the first frequency to the second frequency.

Figure 2:
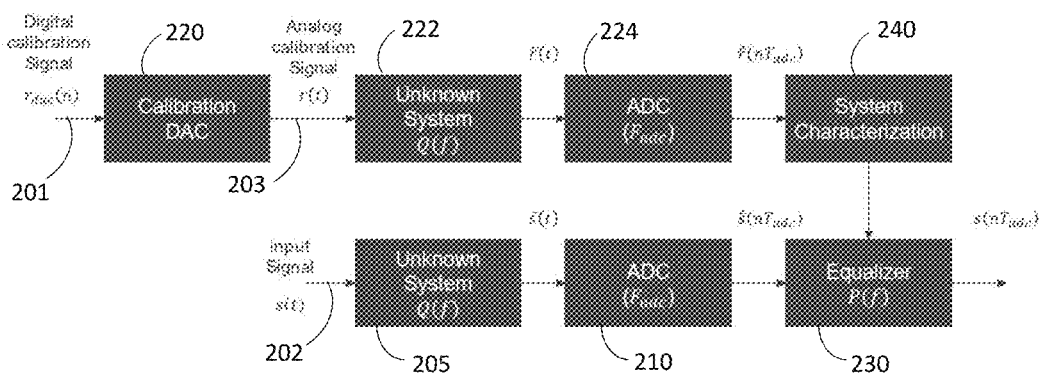
FIG. 2 illustrates an analysis for calibration of an ADC with a calibration DAC.

FIG. 2 illustrates an analysis for calibration of an ADC with a calibration DAC. For simplicity, a linear system will be considered. However, the analysis can be extended to a non-linear system. The system 200 receives an analog input signal s(t) 202. A practical ADC may be considered as comprising an unknown system 205 that may incur a distortion to the processed signal and an ideal ADC 210. The analog input signal 202 is processed by the unknown system 205 and then sampled by the ideal ADC 210. The analog input signal s(t) 202 is distorted by the unknown system 205. The unknown system 205 is a part of the realistic ADC 210 or may further include any system preceding the ADC, e.g., a filter, a buffer, a power amplifier, etc.

The unknown system 205 has an impulse response q(t) and a frequency response Q(f). The output of the unknown system 205 is sampled by the ADC 210 (ideal ADC) with sampling frequency $F_{adc}$. The output of the ADC 210 is processed by an equalizer 230 to remove/reduce the distortion incurred by the unknown system 205. The aim is to find the coefficients/parameters for the digital equalizer 230 that will recover the samples of the original signal, i.e., $s(nT_{adc})$. It can be assumed that the analog input signal s(t) 202 is band-limited to one of the ADC's Nyquist zones, but Q(f) is not zero outside of the frequency range of the input signal. In the analysis below, the first Nyquist zone will be considered. However, the analysis also applies to other Nyquist zones.

The characteristics of the unknown system 205 may be determined by feeding one or more analog calibration signals 203 (i.e., analog reference signals) to the unknown system 205. Let the analog calibration signal 203 be r(t). The calibration DAC 220 generates the analog calibration signal r(t) 203 from the digital calibration signal $r_{dac}(n)$ 201. The calibration signal r(t) 203 is processed by the unknown system 222 and then sampled by the ADC 224. The unknown system 205 and the unknown system 222 may be the same system, and the ADC 210 and the ADC 224 may be the same component.

The output of the unknown system 222 can be written as:

$$\bar{r}(t) = q(t) * r(t) = \mathcal{F}^{-1}\{Q(f)R(f)\}. \quad \text{Equation (1)}$$

$\bar{r}(t)$ is sampled by the ADC 224 at $F_{adc}$. The output of the sampling process is represented by:

$$\bar{\bar{r}}(t) = \bar{r}(t)\Sigma_{n=-\infty}^{\infty}\delta(t-nT_{adc}). \quad \text{Equation (2)}$$

Equation (2) can be rewritten in the frequency domain as:

$$\bar{\bar{R}}(f) = \frac{1}{T_{adc}}\sum_{n=-\infty}^{\infty}\bar{R}\left(f - \frac{n}{T_{adc}}\right). \quad \text{Equation (3)}$$

In terms of the original input signal, $$\bar{\bar{R}}(f) = \frac{1}{T_{adc}}\sum_{n=-\infty}^{\infty}Q\left(f - \frac{n}{T_{adc}}\right)R\left(f - \frac{n}{T_{adc}}\right), \quad \text{Equation (4)}$$

$$\bar{\bar{R}}(f) = \quad \text{Equation (5)}$$

$$\frac{1}{T_{adc}}Q(f)R(f) + \frac{1}{T_{adc}}\sum_{\substack{n=-\infty\\n\neq 0}}^{\infty}Q(f-nF_{adc})R(f-nF_{adc}).$$

If the reference signal is band-limited to the first Nyquist zone, then $$\bar{\bar{R}}(f) = \frac{1}{T_{adc}}Q(f)R(f), \quad -\frac{F_{adc}}{2} < f < \frac{F_{adc}}{2}. \quad \text{Equation (6)}$$

The frequency response of the unknown system 205/222 may be estimated within the first Nyquist zone as follows since $R(f)$ and $\bar{\bar{R}}(f)$ are known.

$$Q(f) = T_{adc}\frac{\bar{\bar{R}}(f)}{R(f)}, \quad -\frac{F_{adc}}{2} < f < \frac{F_{adc}}{2}. \quad \text{Equation (7)}$$

From this, the coefficients/parameters of the equalizer 230 may be estimated by the system characterization circuitry 240, for instance by inverting the frequency response of the unknown system 205/222. Alternatively, other equalization techniques may be applied.

$$P(f) \approx \frac{1}{Q(f)} = \frac{R(f)}{T_{adc}\bar{\bar{R}}(f)}, \quad -\frac{F_{adc}}{2} < f < \frac{F_{adc}}{2}. \quad \text{Equation (8)}$$

$Q(f)$ may be estimated using several signals that cover the full spectrum to be estimated. For instance, multiple sinewaves of different frequencies or any other combination of narrowband signals that cover the spectrum to be estimated may be used.

Assume that the analog reference signal 203 is generated by the calibration DAC 220 operating at $F_{dac}$, the output of the calibration DAC 220 may be expressed as:

$$r(t) = p(t) * (\Sigma_{n=-\infty}^{\infty} r_{dac}(nT_{dac})\,\delta(t-nT_{dac})), \quad \text{Equation (9)}$$

where $p(t)$ is the calibration DAC shaping impulse response convolved with the anti-alias filter following the calibration DAC 220 and $r_{dac}(t)$ is the continuous time analog signal that would be generated by an ideal DAC using $P(f)=P_{ideal}(f)$:

$$P_{ideal}(f) = \begin{cases} T_{dac} & -\frac{F_{dac}}{2} < f < \frac{F_{dac}}{2} \\ 0 & \text{Otherwise} \end{cases}. \quad \text{Equation (10)}$$

The Fourier transform of $r(t)$ is:

$$R(f) = F_{dac}P(f)\Sigma_{n=-\infty}^{\infty}R_{dac}(f-nF_{dac}). \quad \text{Equation (11)}$$

As mentioned above, the ideal reference signal is band-limited to the first Nyquist zone, i.e., $$R_{dac}(f) = 0 \text{ for } -\frac{F_{dac}}{2} < f < \frac{F_{dac}}{2}.$$

However, unless $P(f)=P_{ideal}(f)$, $R(f)$ will not be band-limited. Then the reference signal measured by the ADC will contain an aliasing error $A(f)$.

$$\bar{\bar{R}}(f) = \frac{1}{T_{adc}}Q(f)R(f) + A(f), \quad \text{Equation (12)}$$

$$A(f) = \frac{1}{T_{adc}}\sum_{\substack{p=-\infty\\n\neq 0}}^{\infty}Q\left(f - \frac{n}{T_{adc}}\right)R\left(f - \frac{n}{T_{adc}}\right), \quad \text{Equation (13)}$$

$$A(f) = \frac{F_{dac}}{T_{adc}}\sum_{\substack{p=-\infty\\n\neq 0}}^{\infty}Q(f-nF_{adc}) \quad \text{Equation (14)}$$

$$P(f-nF_{adc})\sum_{k=-\infty}^{\infty}R_{dac}(f-nF_{adc}-kF_{dac}).$$

Consider the case where $R_{dac}(f)$ is a narrowband signal as follows:

$$R_{dac}(f)=0, f \notin f_o, \quad \text{Equation (15)}$$

$$f_o = \{f : 0 \leq f_{low} < |f| < f_{high} < f_{dac}/2\}. \quad \text{Equation (16)}$$

For this case, the aliased components at $f \in f_o$, i.e., the sampling images that fall on top of the desired signal, should meet the following condition:

$$f_o - nF_{adc} - kF_{dac} \in f_o. \quad \text{Equation (17)}$$

For $F_{dac}=F_{adc}$, there will be aliasing components on top of the desired signal for $k=-n$, i.e., $$A(f_o) = \frac{F_{adc}}{T_{adc}}\sum_{\substack{p=-\infty\\n\neq 0}}^{\infty}Q(f_o-nF_{adc})P(f_o-nF_{adc})R_{dac}(f_o). \quad \text{Equation (18)}$$

In examples, the reference signal is generated with the calibration DAC whose $$F_{dac} = \frac{K}{M}F_{adc}$$

and tor this case, the aliased components at $f \in f_o$ should satisfy the following:

$$f_o - nF_{adc} - \frac{kK}{M}F_{adc} \in f_o, \quad \text{Equation (19)}$$

$$f_o - \left(n + \frac{kK}{M}\right)F_{adc} \in f_o, \quad \text{Equation (20)}$$

$$n + \frac{kK}{M} = 0, \quad \text{Equation (21)}$$

$$nM = -kK. \quad \text{Equation (22)}$$

Assuming K and M are mutually prime, the first image that causes aliasing occurs at n=±K and k=∓M. The aliased component are:

$$\frac{F_{dac}}{T_{adc}} Q(f_o \pm KF_{adc}) P(f_o \pm KF_{adc}) R_{dac}(f_o). \quad \text{Equation (23)}$$

The band-limiting requirements of the DAC anti-alias filter are greatly relaxed since the lowest frequency that should be suppressed is $-f_{low}+KF_{adc}$, instead of $-f_{low}+F_{adc}$.

Figure 3:
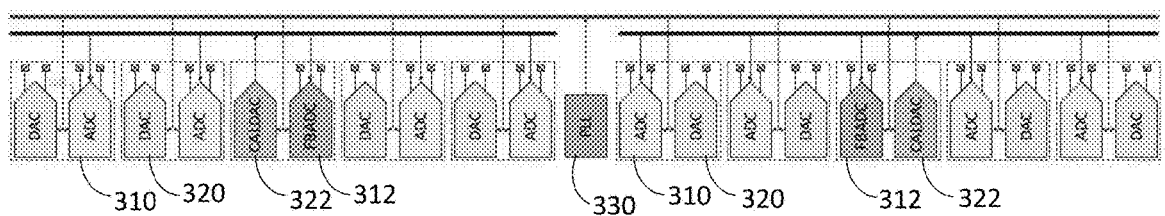
FIG. 3 shows an example floorplan of a multi-channel transceiver configured for ADC calibration.

FIG. 3 shows an example floorplan of a multi-channel transceiver configured for ADC calibration based on a known analog reference signal distributed to each ADC. The transceiver includes a plurality of ADCs 310 and DACs 320 and a phase-locked loop (PLL) 330. One or more of the DACs 320 may be used as a calibration DAC 322 and one or more of the ADCs 310 may be used as a feedback ADC 312 (FBADC). The PLL 330 (clock generator) may be a high-performance on-chip PLL for generating a global clock signal. The calibration DAC 322 generates an analog reference signal for calibration of an ADC 310. The feedback ADC 312 may be used for a transmit chain observation, e.g., power amplifier digital predistortion (DPD) training, etc. With a global clock distribution from the high-performance on-chip PLL 330, all the converters, including the calibration DAC 322, receive the same low-jitter sampling clock.

Figure 4:
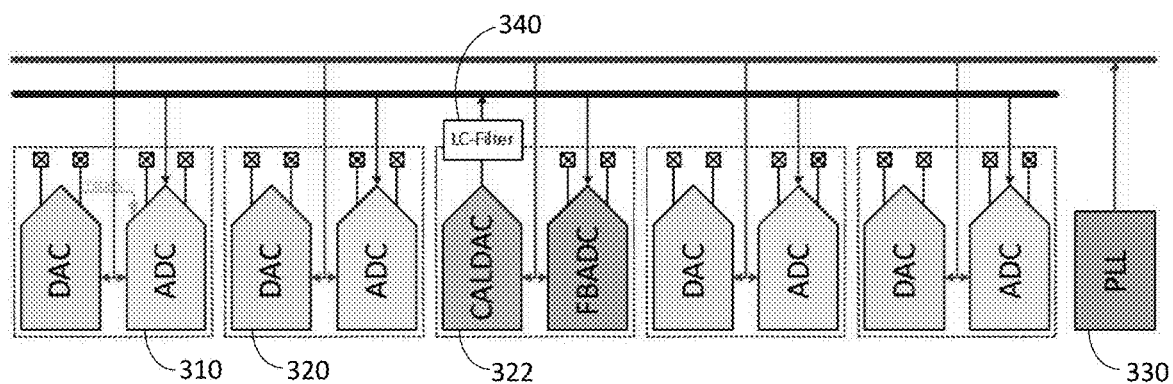
FIG. 4 shows the case that a calibration DAC samples with the same sampling frequency as the ADC under calibration.

FIG. 4 shows the case that a calibration DAC 322 (CALDAC) samples with the same sampling frequency as the ADC 310 under calibration. With $f_{dac}=f_{adc}$, an anti-alias filter 340 (an LC filter) needs to be placed at the output of the calibration DAC 322, as shown in FIG. 4. As mentioned above, in a wideband calibration scenario, with the upper calibration frequency edge close to the ADC's and calibration DAC's Nyquist frequency $f_{ads}/2$ and $f_{dac}/2$, respectively, the anti-alias filter 340 should be of high order to display a sharp transition with sufficient suppression of the lowest image frequency. Such a filter, especially if implemented on-chip, suffers from considerable loss in the transmission band, and it also takes up substantial silicon area.

A difficult case is when the sampling clock provided by the PLL 330 has several possible values, for example to accommodate the frequency planning needs of several possible radio systems. If the variation in the clock frequency is not too large, the LC-filter (the anti-alias filter 340) can be made tunable/trimmable. On the other hand, if the possible variation in the clock frequency is too large (e.g., greater than 30%), then tuning of the LC-filter 340 becomes difficult or impossible, especially for high order LC-filters. In this case multiple filters with an RF multiplexer may be used. However, the silicon area requirement for a multitude of analog LC-filters is obviously incrementally expensive, while the multiplexing of RF signals presents its own difficulties, especially if a high linearity for the reference signal is desired.

Figure 5:
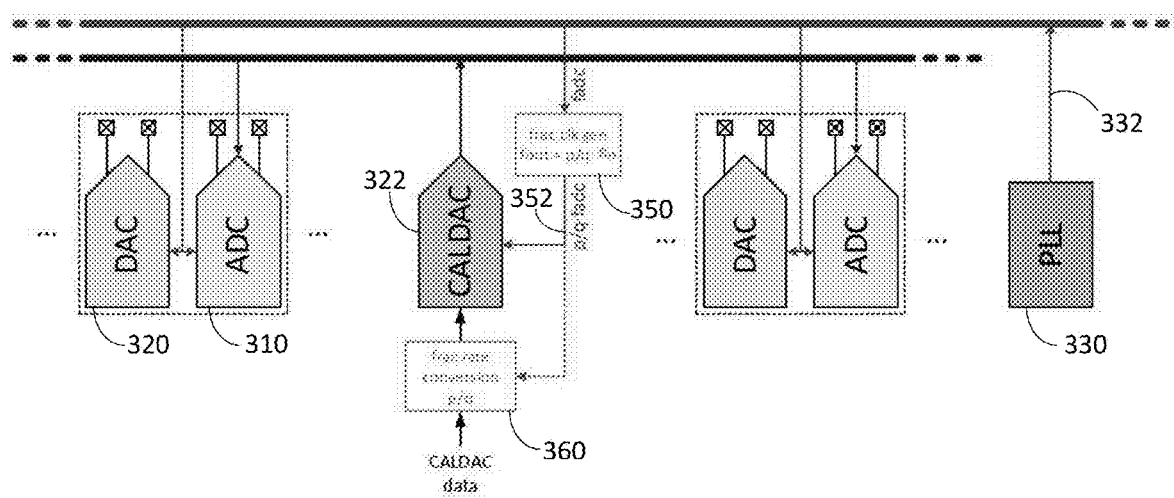
FIG. 5 shows a calibration DAC sampling with a rational fraction of the ADC sampling frequency.

In some examples disclosed herein, the calibration DAC 322 may sample with a rational fraction of the ADC sampling frequency ($f_{adc}$). FIG. 5 shows a calibration DAC sampling with a rational fraction p/q of the ADC sampling frequency ($f_{adc}$). The PLL 330 supplies the sampling clock signal 332 with the frequency $f_{adc}$ to the ADC 310. The fractional rate clock generator 350 also receives the sampling clock signal 322 and generates a fractional rate clock signal 352 at a frequency $f_{dac}$ for the calibration DAC 322. The fractional rate clock generator 350 converts the frequency ($f_{adc}$) of the sampling clock signal 322 to a fractional rate $f_{dac}$, i.e., $f_{dac}=p/q \cdot f_{adc}$, with positive integers p and q. The fractional rate clock signal 352 is used as the sampling clock for the calibration DAC 322.

The calibration DAC 322 generates the analog reference signal from the digital reference signal (i.e., the digital representation of the analog reference signal used for ADC calibration). If the input data (i.e., the digital reference signal (CALDAC data)) for the calibration DAC 322 is available in the ADC sampling rate ($f_{adc}$), a digital fractional rate conversion with a factor p/q may be performed on the input side of the calibration DAC 322. The fractional rate conversion block 360 converts the rate of the digital reference signal to $f_{dac}$ (=P/q·$f_{adc}$).

In one example, p and q may be integers of similar size with p either slightly smaller or slightly greater than q. In this way the sampling rates of the ADC 310 under calibration and the calibration DAC 322 can remain similar, which is then also true for their respective first and second Nyquist frequency bands. For example, the fractional rate may be as follows: $f_{dac}=15/16 \cdot f_{adc}$, $f_{dac}=31/32 \cdot f_{adc}$, $f_{dac}=63/64 \cdot f_{adc}$, etc., or with the corresponding inverse factors.

Figure 6:
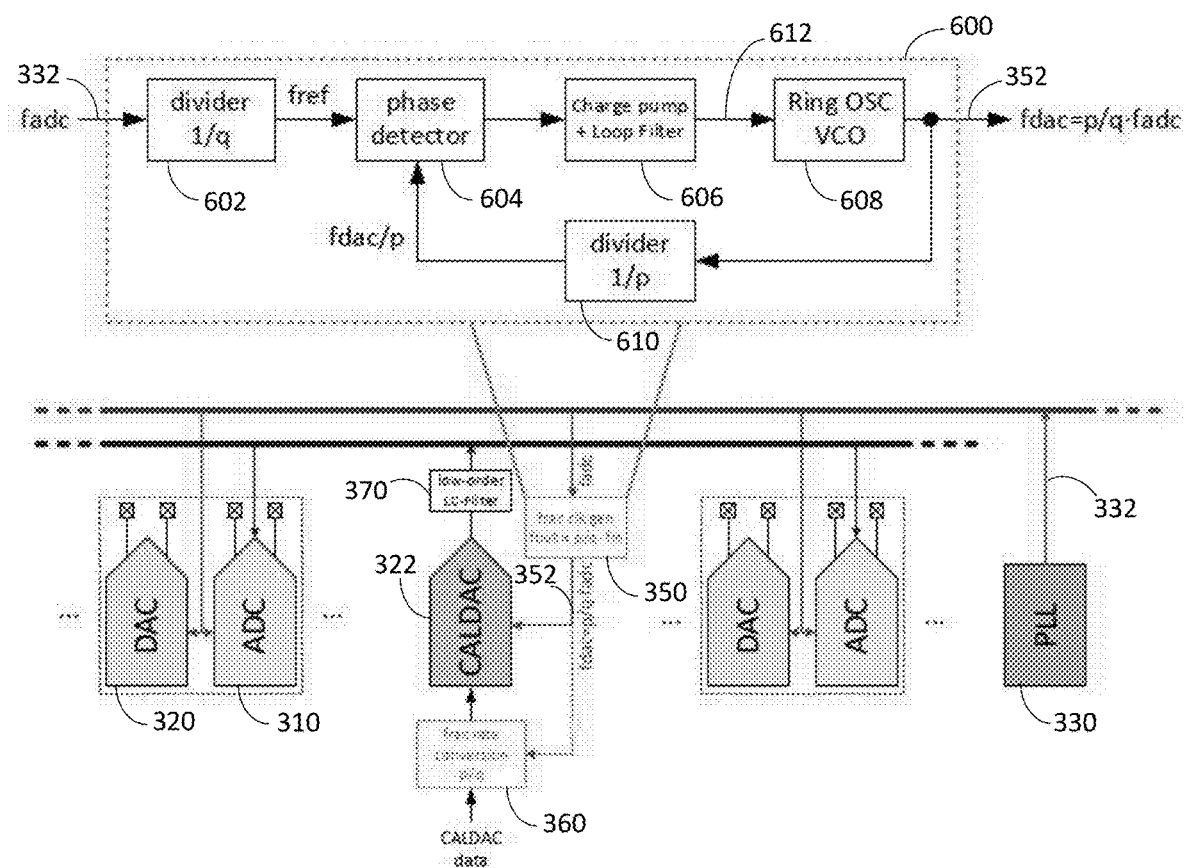
FIG. 6 shows an example fractional clock generator.

FIG. 6 shows an example fractional clock generator 600. In this example, the fractional clock generator 600 is implemented with a (integer) ring oscillator voltage-controlled oscillator (VCO) 608. The ring oscillator VCO 608 includes a chain of inverters coupled in a ring such that an output of one inverter is coupled to an input of the subsequent inverter and an output of the last inverter is coupled to the input of the first inverter in the ring. The ring oscillator VCO 608 oscillates at a certain frequency, which is controlled by a control signal 612. The ring oscillator VCO 608 outputs a fractional clock signal 352 ($f_{dac}$). The fractional clock generator 600 includes an integer clock divider 602. The integer clock divider 602 divides the clock signal 332 ($f_{adc}$) received from the PLL 330 by q. The integer clock divider 610 in the feedback path divides the fractional clock signal 352 ($f_{dac}$) by p. The phase detector 604 detects the phase difference between the output ($f_{ref}$) of the divider 602 and the output of the divider 610 and generates an error signal. A control signal 612 for the ring oscillator VCO 608 is generated by the loop filter 606 based on the error signal. The integer clock divider 610 provides for the multiplication of the reference input clock by p, to which the ring oscillator VCO 608 locks to, i.e., $f_{ref}=f_{adc}/q=f_{dac}/p$. The overall input-output frequency relationship of the clock generation becomes $f_{dac}=p/q \cdot f_{adc}$. Implemented as a so-called all-digital PLL, a ring-oscillator PLL can be implemented extremely efficiently with respect to silicon area and power dissipation. It can also be made tunable over a very wide frequency range, such that operation of the calibration DAC over a wide range of ADC sampling frequencies is possible with the same fractional clock generation circuit.

Alternatively, the fractional clock generator 350 may receive a different input clock than $f_{adc}$, if such a different clock exists in the system and is easily accessible for the fractional clock generator 350. For example, a clock $f_{adc}/m$ may already exist and be easily accessible at the location of the CALDAC. The clock divider 602 of the fractional clock generator 600 may then divide the clock by n, with q=n×m, to provide p/q×$f_{adc}$ for the sampling clock of the CALDAC. The extreme case is to directly use the reference frequency of the central PLL, assuming an integer multiplication factor, i.e., integer $k=f_{adc}/f_{ref}$. Then, $q=1$ and $p=k+/-k1$ with small integer k1. This only makes sense for a sufficiently large k, if the CALDAC sampling frequency should be close to $f_{adc}$, i.e., $p/q\sim 1$. On the other hand, if the central PLL is a fractional PLL and operated as such, the described method with first dividing $f_{adc}$ by q and using $f_{adc}/q$ as the reference input frequency for the clock multiplying operation by p (e.g., with a local integer PLL) would be the simplest method.

In some examples, a low-order LC-filter 370 may be added at the output of the calibration DAC 322 to filter the higher-frequency image components of the calibration DAC 322, which makes the ADC calibration operation easier.

As explained above, the digital reference data (CALDAC data) input to the calibration DAC 322 may be provided via fractional rate data conversion in case the digital reference data is presented at the ADC sampling rate $f_{adc}$. In one example, the data rate conversion unit 360 may skip q-p samples out of q received samples (if q>p, i.e., $f_{caldac}=p/q \times f_{adc} < f_{adc}$), for example if the CALDAC data is presented in a multiphase form out of an on-chip memory, e.g., random access memory (RAM). In case p>q, which means $f_{caldac} > f_{adc}$ an actual fractional rate conversion filter may be used for up-sampling. This requires buffering of q samples and transferring only p samples to the calibration DAC 322 to match the sampling rate, i.e., present the samples to the calibration DAC 322 at a rate $f_{dac}$. The data preparation in the on-chip RAM needs to take this into account. Alternatively, a digital fractional rate filter may be used to convert from the original sampling rate $f_{adc}$ to the fractional rate $f_{dac}$. The samples presented to the calibration DAC 322 may be re-sampled by the digital fractional rate filter at the rate $f_{dac}$ from the original samples received at the rate $f_{adc}$.

Alternatively, the fractional rate clock generator 350 with PLL may be implemented differently. For example, a more sophisticated PLL may be used for the fractional rate clock generator 350, for example driven by availability and compatibility with system requirements. Although a ring oscillator PLL has advantages due to its simplicity, area efficiency, and the wide output frequency range achievable with the same VCO core, in systems with a fixed clock rate, an LC PLL in the system may be (re-)used to generate the fractional clock signal.

Alternatively, a fractional PLL may be used instead of an integer PLL to generate the output frequencies that relate to the input frequency as a rational fraction, i.e., p and q are rational numbers instead of integers. This allows even more flexibility in the choice of sampling rate for the calibration DAC 322, especially the ability to change the output frequency in very small steps (a fraction of the reference frequency). In this case, a digital fractional rate conversion filter may be used to convert the data rate of the digital reference data (CALDAC data) at the calibration DAC input. A fractional PLL may be implemented with either an LC VCO or a ring-oscillator VCO.

Figure 7:
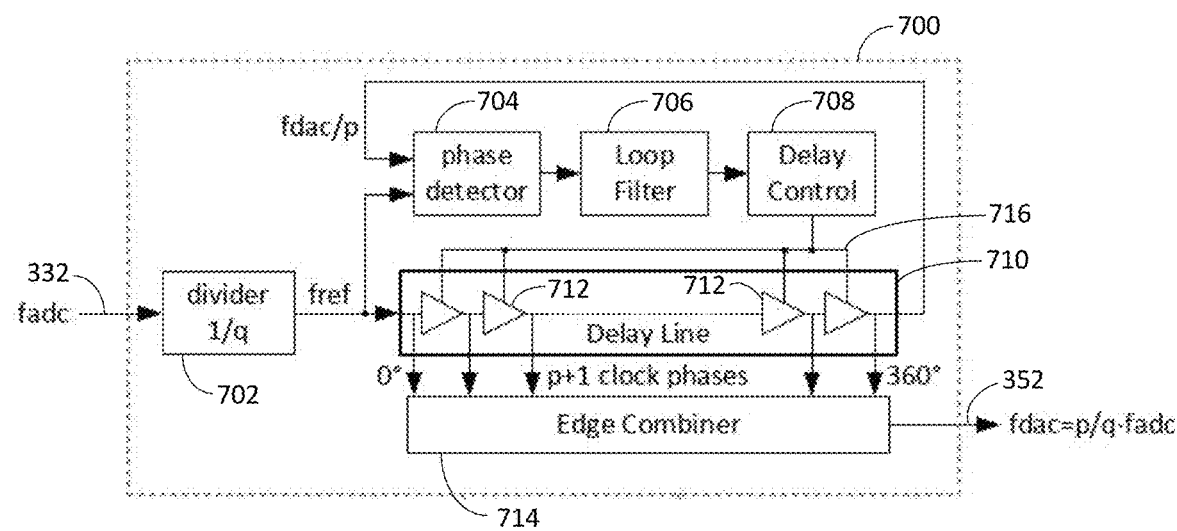
FIG. 7 shows another example of fractional rate clock generator implemented with a multiplying delay locked loop.

FIG. 7 shows another example of fractional rate clock generator 700 implemented with a multiplying delay locked loop (DLL). The fractional rate clock generator 700 receives the clock signal 332 from the PLL 330. The integer clock divider 702 divides the clock signal 332 by q. The divided clock signal $f_{ref}=f_{adc}/q$ is fed to the DLL 710 and the phase detector 704. The DLL 710 includes a chain of delay gates 712 coupled in series. The divided clock signal at $f_{ref}$ is delayed by the delay gates 712 and output to the phase detector 704. The phase detector 704 detects the phase difference between the divided clock signal at $f_{ref}$ and the output of the DLL 710 and generates an error signal. The error signal is filtered by the loop filter 706 and the delay control unit 708 generates a control signal 716 for the DLL 710 based on the filtered error signal from the loop filter 706. The propagation speed of the delay gates 712 in the DLL 710 is controlled by the control signal 716 such that the input and the output of the DLL 710 becomes in phase. The edge combiner 714 generates the fractional rage clock signal 352 from the p+1 clock phase signals tapped from the delay line of the DLL 710.

The multiplying DLL (mDLL) does not offer the full flexibility of a PLL but is easier to implement and potentially more area efficient. Programmability of the multiplying factor p can be achieved by changing the length of the delay line (the number of output clock phases) by using different taps for the feedback phase with a programmable clock multiplexer (not shown in FIG. 7), provided that the delay cells have enough tuning range to accommodate different lengths of the delay line for a given input reference frequency.

Figure 8:
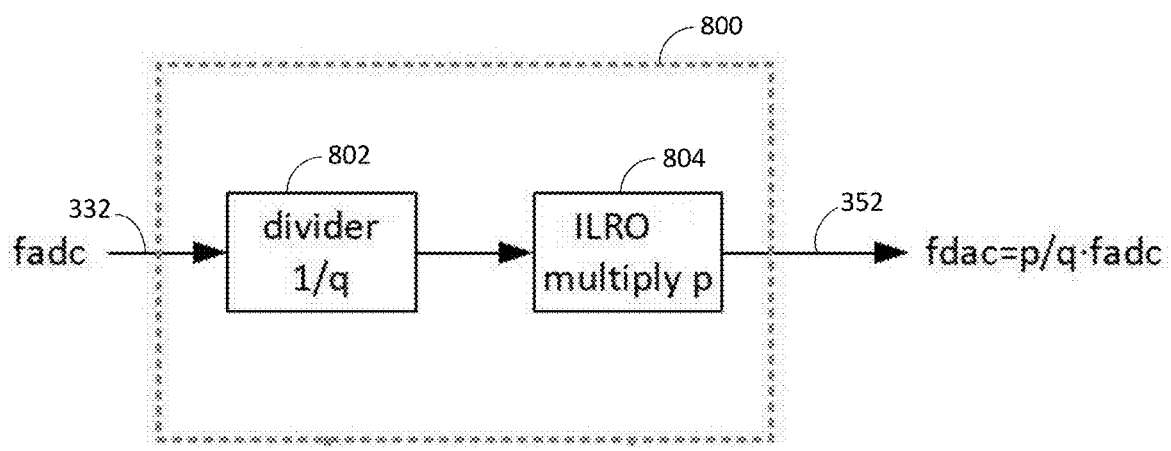
FIG. 8 shows another example of fractional rate clock generator implemented with an open loop clock multiplier.

FIG. 8 shows another example of fractional rate clock generator 800 implemented with an open loop clock multiplier (frequency multiplier). The fractional rate clock generator 800 includes an integer clock divider 802 and a frequency multiplier 804. The fractional rate clock generator 800 receives the clock signal 332 from the PLL 330. The integer clock divider 802 divides the clock signal 332 by q. The frequency multiplier 804 then multiplies the divided clock signal ($f_{adc}/q$) by p to generate the fractional rate clock signal 352 $f_{dac}=p/q \cdot f_{adc}$.

Depending on the requirements, for example, the frequency multiplier 804 (by integer factor p) may be realized as an injection-locked ring oscillator (ILRO) that can offer a significant tuning range. In examples, a more narrowband solution with a chain of tuned injection-locked frequency multipliers may be used. By adding a frequency control loop injection-locked oscillator approaches also allow substantial multiplication factors in a single stage, at the expense of design complexity similar to a full PLL. In general, the frequency tuned approaches require on-chip inductor structures and are efficient for higher output frequencies.

Figure 9:
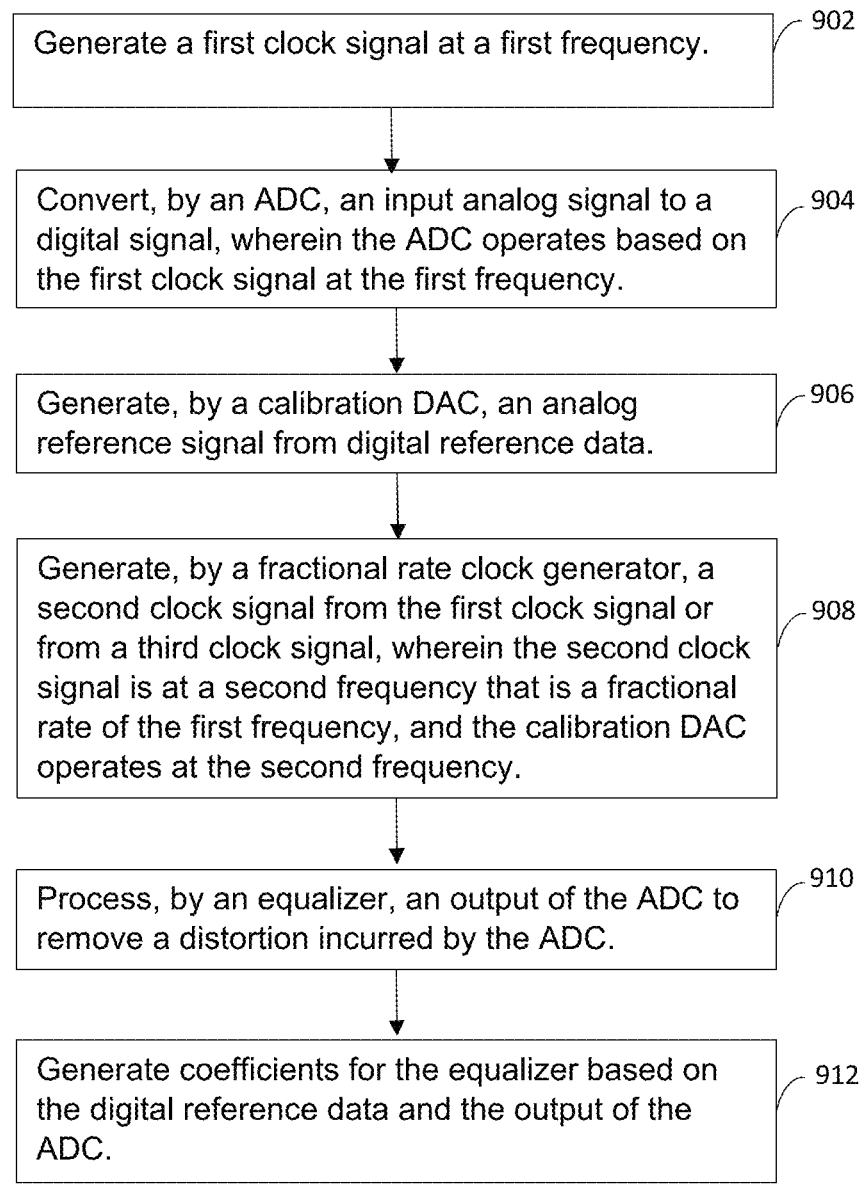
FIG. 9 is a flow diagram of a method for calibrating an ADC.

FIG. 9 is a flow diagram of a method for calibrating an ADC. The method includes generating a first clock signal at a first frequency (902). The first clock signal may be a global clock signal distributed to all components in the system. The first frequency may be the sampling frequency of the ADC ($f_{adc}$). The method further includes converting, by an ADC, an input analog signal to a digital signal, wherein the ADC operates based on the first clock signal at the first frequency (904). The method further includes generating, by a calibration DAC, an analog reference signal from digital reference data (906). The analog reference signal (calibration signal) is injected to the ADC for calibration of the ADC. The method further includes generating, by a fractional rate clock generator, a second clock signal from the first clock signal or from a third clock signal (908). The third clock signal is at a third frequency f3 and has an integer frequency relation with the ADC clock $f_{adc}$ or the central PLL reference frequency. For example, the third clock signal may be at the reference frequency (or a divided version thereof) of the central PLL. This requires using a different division factor q2 at the input of the fractional rate clock generator 350. $q1=f_{adc}/f3 \rightarrow q=q1 \times q2 \rightarrow q2=q/q1=q \times f3/f_{adc}$. Overall, $f_{caldac}=p/q2 \times f3=p/q \times f_{adc}/f3 \times f3=p/q \times f_{adc}$. As described before, p could be a rational number instead of an integer, if the fractional rate clock generator is implemented as a fractional PLL.

The second clock signal is at a second frequency that is a fractional rate of the first frequency, and the calibration DAC operates at the second frequency. The method further includes processing, by an equalizer, an output of the ADC to remove a distortion incurred by the ADC (910). The method further includes generating coefficients for the equalizer based on the digital reference data and the output of the ADC to the calibration reference signal (912). The method may include supplying the digital reference data received at the first frequency to the calibration DAC at the second frequency. The fractional rate may be close to one.

Figure 10:
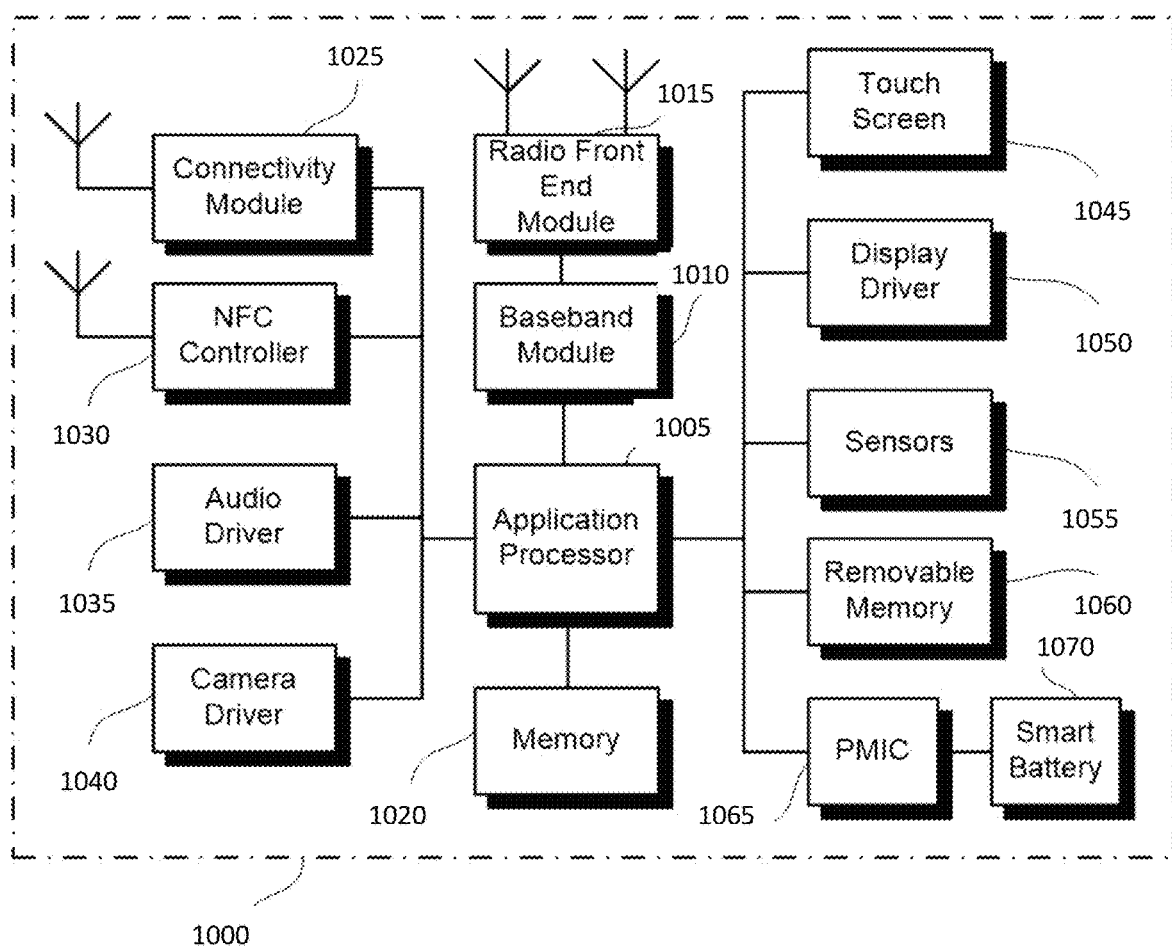
FIG. 10 illustrates a user device in which the examples disclosed herein may be implemented.

FIG. 10 illustrates a user device 1000 in which the examples disclosed herein may be implemented. For example, the examples disclosed herein may be implemented in the radio front-end module 1015, in the baseband module 1010, etc. The user device 1000 may be a mobile device in some aspects and includes an application processor 1005, baseband processor 1010 (also referred to as a baseband module), radio front end module (RFEM) 1015, memory 1020, connectivity module 1025, near field communication (NFC) controller 1030, audio driver 1035, camera driver 1040, touch screen 1045, display driver 1050, sensors 1055, removable memory 1060, power management integrated circuit (PMIC) 1065 and smart battery 1070.

In some aspects, application processor 1005 may include, for example, one or more CPU cores and one or more of cache memory, low drop-out voltage regulators (LDOs), interrupt controllers, serial interfaces such as serial peripheral interface (SPI), inter-integrated circuit (I2C) or universal programmable serial interface module, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 1010 may be implemented, for example, as a solder-down substrate including one or more integrated circuits, a single packaged integrated circuit soldered to a main circuit board, and/or a multi-chip module containing two or more integrated circuits.

Figure 11:
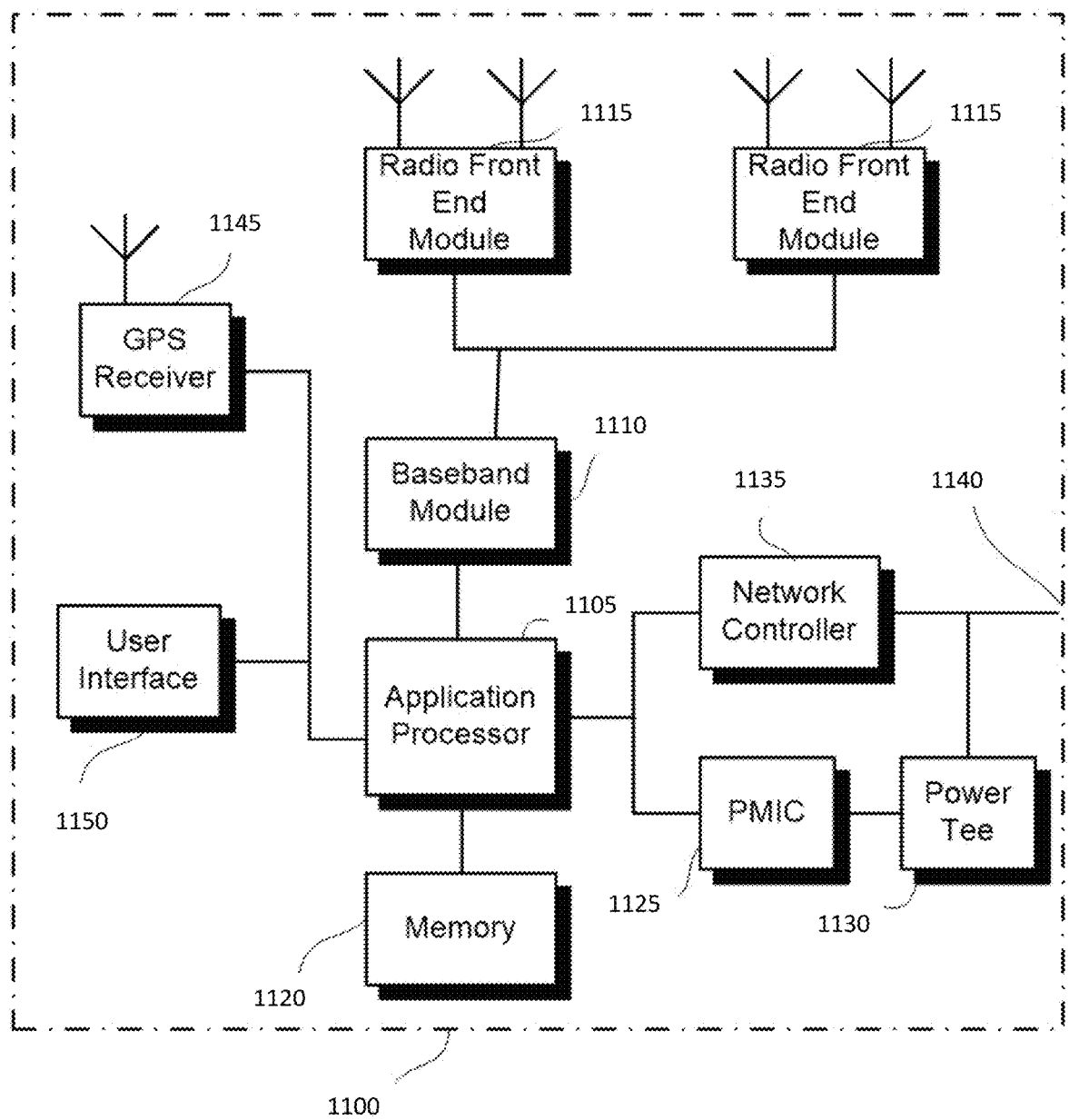
FIG. 11 illustrates a base station or infrastructure equipment radio head in which the examples disclosed herein may be implemented.

FIG. 11 illustrates a base station or infrastructure equipment radio head 1100 in which the examples disclosed herein may be implemented. For example, the examples disclosed herein may be implemented in the radio front-end module 1115, in the baseband module 1110, etc. The base station radio head 1100 may include one or more of application processor 1105, baseband modules 1110, one or more radio front end modules 1115, memory 1120, power management circuitry 1125, power tee circuitry 1130, network controller 1135, network interface connector 1140, satellite navigation receiver module 1145, and user interface 1150.

In some aspects, application processor 1105 may include one or more CPU cores and one or more of cache memory, low drop-out voltage regulators (LDOs), interrupt controllers, serial interfaces such as SPI, I2C or universal programmable serial interface module, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 1110 may be implemented, for example, as a solder-down substrate including one or more integrated circuits, a single packaged integrated circuit soldered to a main circuit board or a multi-chip module containing two or more integrated circuits.

In some aspects, memory 1120 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magneto resistive random access memory (MRAM) and/or a three-dimensional crosspoint memory. Memory 1120 may be implemented as one or more of solder down packaged integrated circuits, socketed memory modules and plug-in memory cards.

In some aspects, power management integrated circuitry 1125 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 1130 may provide for electrical power drawn from a network cable to provide both power supply and data connectivity to the base station radio head 1100 using a single cable.

In some aspects, network controller 1135 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 1145 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 1145 may provide data to application processor 1105 which may include one or more of position data or time data. Application processor 1105 may use time data to synchronize operations with other radio base stations.

In some aspects, user interface 1150 may include one or more of physical or virtual buttons, such as a reset button, one or more indicators such as light emitting diodes (LEDs) and a display screen.

Another example is a computer program having a program code for performing at least one of the methods described herein, when the computer program is executed on a computer, a processor, or a programmable hardware component. Another example is a machine-readable storage including machine readable instructions, when executed, to implement a method or realize an apparatus as described herein. A further example is a machine-readable medium including code, when executed, to cause a machine to perform any of the methods described herein.

The examples as described herein may be summarized as follows:

An example (e.g., example 1) relates to an analog-to-digital conversion system. The system includes a clock generator configured to generate a first clock signal at a first frequency, an ADC configured to convert an input analog signal to a digital signal, wherein the ADC operates based on the first clock signal at the first frequency, a calibration DAC configured to generate an analog reference signal from digital reference data, a fractional rate clock generator configured to generate a second clock signal from the first clock signal or a third clock signal, wherein the second clock signal is at a second frequency that is a fractional rate of the first frequency, and the calibration DAC operates at the second frequency, wherein the third clock signal is at a third frequency having an integer frequency relation with the first frequency, an equalizer configured to process an output of the ADC to remove a distortion incurred by the ADC, and an adaptation circuitry configured to generate coefficients for the equalizer based on the output of the ADC to analog the reference signal.

Another example (e.g., example 2) relates to a previously described example (e.g., example 1), wherein the system further includes a data rate conversion block configured to supply the digital reference data received at the first frequency to the calibration DAC at the second frequency.

Another example (e.g., example 3) relates to a previously described example (e.g., example 2), wherein the data rate conversion block is configured to skip q-p samples out of q received samples, wherein the fractional rate is p/q.

Another example (e.g., example 4) relates to a previously described example (e.g., any one of examples 2-3), wherein the data rate conversion block is a digital fractional rate filter configured to convert the digital reference data from the first frequency to the second frequency.

Another example (e.g., example 5) relates to a previously described example (e.g., any one of examples 1-4), wherein the fractional rate is close to one.

Another example (e.g., example 6) relates to a previously described example (e.g., any one of examples 1-5), wherein the fractional rate clock generator includes a first divider configured to divide the first clock signal by a factor of q, a ring oscillator configured to generate the second clock signal, a second divider configured to divide an output of the ring oscillator by a factor of p, a phase detector configured to detect a phase difference between outputs of the first divider and the second divider and generate an error signal, and a loop filter configured to filter the error signal to generate a control signal to the ring oscillator for controlling an oscillating frequency of the ring oscillator.

Another example (e.g., example 7) relates to a previously described example (e.g., example 6), wherein p and q are positive integers.

Another example (e.g., example 8) relates to a previously described example (e.g., example 6), wherein p and q are rational numbers.

Another example (e.g., example 9) relates to a previously described example (e.g., any one of examples 1-8), wherein the fractional rate clock generator includes a divider configured to generate a reference clock signal by dividing the first clock signal by a factor of q, a delay line comprising a chain of delay gates coupled in series, wherein the delay line receives the reference clock signal at one end and outputs a delayed reference clock signal at the other end, a phase detector configured to detect a phase difference between the reference clock signal and the delayed reference clock signal to generate an error signal, a loop filter configured to filter error signals, a delay control block configured to generate a control signal based on the filtered error signals, wherein the delay line is controlled by the control signal, and an edge combiner configured to combine p+1 clock phases tapped from the delay line to generate the second clock signal.

Another example (e.g., example 10) relates to a previously described example (e.g., any one of examples 1-8), wherein the fractional rate clock generator includes a divider configured to generate a reference clock signal by dividing the first clock signal by a factor of q, and a frequency multiplier configured to multiply the reference clock signal by a factor of p.

Another example (e.g., example 11) relates to a previously described example (e.g., example 10), wherein the frequency multiplier is an injection-locked ring oscillator.

Another example (e.g., example 12) relates to a previously described example (e.g., any one of examples 1-11), further comprising an LC filter configured to filter the analog reference signal from the calibration DAC.

Another example (e.g., example 13) relates to a user equipment including the analog-to-digital conversion system of any one of examples 1-12.

Another example (e.g., example 14) relates to a base station including the analog-to-digital conversion system of any one of examples 1-12.

Another example (e.g., example 15) relates to a method for calibrating an ADC. The method includes generating a first clock signal at a first frequency, converting, by an ADC, an input analog signal to a digital signal, wherein the ADC operates based on the first clock signal at the first frequency, generating, by a calibration DAC, an analog reference signal from digital reference data, generating, by a fractional rate clock generator, a second clock signal from the first clock signal or a third clock signal, wherein the second clock signal is at a second frequency that is a fractional rate of the first frequency, and the calibration DAC operates at the second frequency, wherein the third clock signal is at a third frequency having an integer frequency relation with the first frequency, processing, by an equalizer, an output of the ADC to remove a distortion incurred by the ADC, and generating coefficients for the equalizer based on the digital reference data and the output of the ADC to the analog reference signal.

Another example (e.g., example 16) relates to a previously described example (e.g., example 15), further comprising supplying the digital reference data received at the first frequency to the calibration DAC at the second frequency.

Another example (e.g., example 17) relates to a previously described example (e.g., any one of examples 15-16), wherein the fractional rate is close to one.

Another example (e.g., example 18) relates to a previously described example (e.g., any one of examples 15-17), further comprising filtering the analog reference signal from the calibration DAC.

Another example (e.g., example 19) relates to a non-transitory machine-readable medium including code, when executed, to cause a machine to perform a method of any one of examples 15-18.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

The invention claimed is:

1. An analog-to-digital conversion system, comprising:
 a clock generator configured to generate a first clock signal at a first frequency;
 an analog-to-digital converter (ADC) configured to convert an input analog signal to a digital signal, wherein the ADC operates based on the first clock signal at the first frequency;
 a calibration digital-to-analog converter (DAC) configured to generate an analog reference signal from digital reference data;
 a fractional rate clock generator configured to generate a second clock signal from the first clock signal or from a third clock signal, wherein the second clock signal is at a second frequency that is a fractional rate of the first frequency, and the calibration DAC operates at the second frequency, wherein the third clock signal is at a third frequency having an integer frequency relation with the first frequency;
 an equalizer configured to process an output of the ADC to remove a distortion incurred by the ADC; and
 an adaptation circuitry configured to generate coefficients for the equalizer based on the output of the ADC to the analog reference signal.

2. The analog-to-digital conversion system of claim 1, further comprising:
 a data rate conversion block configured to supply the digital reference data received at the first frequency to the calibration DAC at the second frequency.

3. The analog-to-digital conversion system of claim 2, wherein the data rate conversion block is configured to skip q-p samples out of q received samples, wherein the fractional rate is p/q.

4. The analog-to-digital conversion system of claim 2, wherein the data rate conversion block is a digital fractional rate filter configured to convert the digital reference data from the first frequency to the second frequency.

5. The analog-to-digital conversion system of claim 1, wherein the fractional rate is close to one.

6. The analog-to-digital conversion system of claim 1, wherein the fractional rate clock generator comprises:
 a first divider configured to divide the first clock signal by a factor of q;
 a ring oscillator configured to generate the second clock signal;
 a second divider configured to divide an output of the ring oscillator by a factor of p;
 a phase detector configured to detect a phase difference between outputs of the first divider and the second divider and generate an error signal; and
 a loop filter configured to filter the error signal to generate a control signal to the ring oscillator for controlling an oscillating frequency of the ring oscillator.

7. The analog-to-digital conversion system of claim 6, wherein p and q are positive integers.

8. The analog-to-digital conversion system of claim 6, wherein p and q are rational numbers.

9. The analog-to-digital conversion system of claim 1, wherein the fractional rate clock generator comprises:
- a divider configured to generate a reference clock signal by dividing the first clock signal by a factor of q;
- a delay line comprising a chain of delay gates coupled in series, wherein the delay line receives the reference clock signal at one end and outputs a delayed reference clock signal at the other end;
- a phase detector configured to detect a phase difference between the reference clock signal and the delayed reference clock signal to generate an error signal;
- a loop filter configured to filter error signals;
- a delay control block configured to generate a control signal based on the filtered error signals, wherein the delay line is controlled by the control signal; and
- an edge combiner configured to combine p+1 clock phases tapped from the delay line to generate the second clock signal.

10. The analog-to-digital conversion system of claim 1, wherein the fractional rate clock generator comprises:
- a divider configured to generate a reference clock signal by dividing the first clock signal by a factor of q; and
- a frequency multiplier configured to multiply the reference clock signal by a factor of p.

11. The analog-to-digital conversion system of claim 10, wherein the frequency multiplier is an injection-locked ring oscillator.

12. The analog-to-digital conversion system of claim 1, further comprising an LC filter configured to filter the analog reference signal from the calibration DAC.

13. A user equipment including the analog-to-digital conversion system of claim 1.

14. A base station including the analog-to-digital conversion system of claim 1.

15. A method for calibrating an analog-to-digital converter (ADC), comprising:
- generating a first clock signal at a first frequency;
- converting, by an ADC, an input analog signal to a digital signal, wherein the ADC operates based on the first clock signal at the first frequency;
- generating, by a calibration digital-to-analog converter (DAC), an analog reference signal from digital reference data;
- generating, by a fractional rate clock generator, a second clock signal from the first clock signal or from a third clock signal, wherein the second clock signal is at a second frequency that is a fractional rate of the first frequency, and the calibration DAC operates at the second frequency, wherein the third clock signal is at a third frequency having an integer frequency relation with the first frequency;
- processing, by an equalizer, an output of the ADC to remove a distortion incurred by the ADC; and
- generating coefficients for the equalizer based on the digital reference data and the output of the ADC to the analog reference signal.

16. The method of claim 15, further comprising:
- supplying the digital reference data received at the first frequency to the calibration DAC at the second frequency.

17. The method of claim 15, wherein the fractional rate is close to one.

18. The method of claim 15, further comprising:
- filtering the analog reference signal from the calibration DAC.

19. A non-transitory machine-readable medium including code, when executed, to cause a machine to perform a method of claim 15.

* * * * *